United States Patent
Takayanagi

(10) Patent No.: US 6,885,610 B2
(45) Date of Patent: Apr. 26, 2005

(54) PROGRAMMABLE DELAY FOR SELF-TIMED-MARGIN

(75) Inventor: Toshinari Takayanagi, San Jose, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 10/411,928

(22) Filed: Apr. 11, 2003

(65) Prior Publication Data

US 2004/0202039 A1 Oct. 14, 2004

(51) Int. Cl.[7] .................................................. G11C 8/00
(52) U.S. Cl. .................... 365/233; 365/194; 365/189.02
(58) Field of Search ................................. 365/233, 194, 365/189.02, 205, 233.5

(56) References Cited

U.S. PATENT DOCUMENTS

| | | | |
|---|---|---|---|
| 5,136,545 A | 8/1992 | Takayanagi | |
| 5,210,236 A | 5/1993 | Takayanagi | |
| 5,287,323 A | 2/1994 | Takahashi et al. | |
| 5,317,201 A | 5/1994 | Takayanagi | |
| 5,396,448 A | 3/1995 | Takayanagi et al. | |
| 5,715,426 A | 2/1998 | Takahashi et al. | |
| 6,011,713 A | 1/2000 | Yamane et al. | |
| 6,289,438 B1 | 9/2001 | Takayanagi | |
| 6,343,039 B2 | 1/2002 | Agawa et al. | |
| 6,505,225 B1 | 1/2003 | Takayanagi | |
| 6,600,681 B1 * | 7/2003 | Korger et al. | ............... 365/193 |
| 6,665,230 B1 * | 12/2003 | Shrader et al. | ............. 365/233 |
| 2001/0007537 A1 | 7/2001 | Agawa et al. | |

FOREIGN PATENT DOCUMENTS

| | | |
|---|---|---|
| JP | 06-203576 | 7/1994 |
| JP | 10188571 | 7/1998 |
| JP | 2000122924 | 4/2000 |
| JP | 2001195885 | 7/2001 |
| JP | 2001216136 | 8/2001 |
| KR | 89910 | 10/1995 |

* cited by examiner

*Primary Examiner*—David Lam
(74) *Attorney, Agent, or Firm*—Hamilton & Terrile, LLP; Michael Rocco Cannatti

(57) ABSTRACT

A system and method for adjusting the clock delay in a self-timed memory system having a memory array and a sense amplifier includes a programmable delay circuit coupled as an input to the sense amplifier for controlling the timing of when the sense amplifier is enabled in relation to the memory array addressing by generating a plurality of delayed versions of the sense amplifier enable signal and coupling one of the delayed versions of the sense amplifier enable signal to the sense amplifier in response to a control signal. By multiplexing multiple delayed versions of the sense amplifier enable signal under control of programmable delay selection logic, an optional delay is provided to make enable the sense amplifier more quickly or more slowly in reference to a memory array signal, depending upon control signal inputs to the selection logic.

20 Claims, 5 Drawing Sheets

PROGRAMMABLE DELAY FOR SELF-TIMED-MARGIN

BACKGROUND OF THE INVENTION

1. Field of the Invention

The present invention relates to the field of digital electronic circuits, specifically, VLSI circuit design and operation. In one aspect, the present invention relates to a technique for flexibly controlling circuit performance by providing a programmable delay between circuit elements.

2. Description of the Related Art

Generally, VLSI circuit design entails coordinating the connection and interaction of multiple complex circuit elements such that the overall circuit performance is achieved by the propagation of signals throughout the overall circuit. Given the complexity of such circuits and the varying conditions and propagation path lengths for circuit signals, it can be difficult to design the circuit so that an appropriate delay is provided to maintain the necessary timing interval between two events. This is often called "self-timed-margin." This difficulty arises for a variety of reasons. For example, a specific delay may not scale proportionally over process variation, voltage variation or temperature variation. As a result, delay that is appropriate at one simulation condition can be insufficient at another condition. For example, a delay design which is appropriate at nominal condition often violates the timing margin constraints at burn-in condition (which imposes very high voltage and temperature). To meet the timing margin constraint across all the conditions, conventional approaches can result in circuit over-design to keep more-than-needed margin at nominal operation conditions, which results in performance loss.

FIG. 1 shows a conventional delay generation scheme used in the context of a memory circuit 10 having an address predecode circuit 14, address decoder circuit 16 and a memory array 18. As depicted, address data 11 for selecting a particular memory cell from the memory circuit 10 are input to the address predecoder circuit 14 which includes a plurality of logic gates for generating a predecode signal 15 ("predec") that is provided to the address decoder circuit 16. Based upon the predecode signal 15, address decoder 16 selects a particular wordline (e.g., wordline 19) using address decode logic contained within the address decode circuit 16. As the wordline signal 19 propagates through the memory array 18 to select a row of memory cells, including memory cell 20, bitline selection logic (not shown) also generates bitline selection signals to connect the memory cell 20 through bitlines 21, 22 to the sense amplifier 23 for generating a data output 25 ("dout") from the memory.

Persons skilled in the art will appreciate that the particular address decode logic comprises a plurality of logic gates (e.g., gates 17) that will impose a predetermined amount of delay on the propagation of the wordline selection signal. To allow sufficient time for a differential signal to be developed across bitlines 21 and 22 before the sense amplifier 23 is enabled, an enable signal 24 for the sense amplifier is generated from the predecode signal 15 output from the predecode circuit 14 using a fixed delay circuit 26 coupled between the address predecode circuit 14 and the sense amplifier 23. As shown, the fixed delay circuit comprises an OR gate coupled to inverters which serve to generate a single delayed version of the precode signal 15. The sense amplifier enable signal 24 must be slower than the wordline select signal 19 to allow sufficient time for the data stored in the memory cell 20 to propagate as a differential signal across the bitlines 21, 22 so that the sense amplifier 23 can operate properly.

The operation of the conventional approach is shown in FIG. 2 which depicts a timing diagram for selected signals generated in the memory circuit example of FIG. 1. As shown in FIG. 2, a clock input 8 to the memory circuit 10 is received at the address predecode circuit 14 which acts upon the input address data 11 to generate a predecode signal 15 as an output from the address predecode circuit 14. As shown, the rising edge of the predecode signal 15 propagates through the address decoder 16 to generate a transition in the wordline 19 that is used to select memory cell 20 from the memory array 18. In addition, the predecode signal 15 also propagates through the fixed delay circuit 26 to cause a transition in the sense amplifier enable signal 24 which occurs at a predetermined interval 29 (tmargin) after the wordline signal transition. As will be appreciated, the delay in the transition of the sense amplifier signal 24 must be sufficient to permit wordline and bitline selection signal propagation, but must also permit sufficient time for a differential signal 27 to develop across the bitlines 21, 22 which must overcome circuit capacitance (for example, from the bitlines, memory cells, sense amplifier, etc.) and imbalances of the capacitance. This is shown in FIG. 2 as the minimum time interval "tbitline" 28.

While it is known that a predetermined delay must be provided between circuit elements so that the sense amplifier is enabled after the memory cell is connected to the bitlines, the use of a fixed delay circuit 26 does not provide for flexibility in selecting among multiple delay intervals depending upon circuit operation requirements or other considerations. In addition, even within a particular circuit application, the use of the same fixed delay circuit 26 in multiple portions of the same circuit may result in undesirable signal delays where the desired delay does not scale proportionally over the entire circuit, due to process variations, voltage variations, temperature variations, or other inconsistencies in the circuit design or construction.

Further limitations and disadvantages of conventional systems will become apparent to one of skill in the art after reviewing the remainder of the present application with reference to the drawings and detailed description which follow.

SUMMARY OF THE INVENTION

In accordance with the present invention, a programmable, self-timed circuit is provided that adjusts the delay between circuit elements according to the timing margin requirements of the particular circuit design and/or condition. As a result of the programmable delay circuit, the timing of a signal path between a first circuit and a second circuit in a clocked logic system is controlled. In one embodiment, a programmable multiplexer or selector circuit is controlled by values stored in a control register to select among available delay options to provide a self-timed circuit that can operate in a variety of different modes by optionally providing a faster or slower delay or a different delay trigger as required, thereby permitting the system to operate at the fastest speed the components and environment allow. The available delay paths may be generated by a plurality of delay circuits coupled to the second circuit, and a selector circuit couples one of the plurality of delayed versions of the input signal in response to a selection control signal. For example, a programmable delay for a self-timed circuit for use in a clocked logic system is provided by selecting from between a plurality of available signal delay paths so that a given signal propagating from a first circuit component to a second circuit component has a specified timing margin. The selected signal delay path is chosen on the basis of input control signals that are programmably generated to meet specific circuit operation requirements. In a selected embodiment, circuit test signals are used as input control signals to generate a multiplexer control signal that selects from multiple signal delay path inputs to pass the signal having the desired delay. Thus, the timing margin of a selected signal path is programmably controlled with "increase" logic for increasing the delay of the selected signal if the timing margin permits, and "decrease" logic for decreasing the delay of the selected signal if the timing margin permits.

In accordance with an alternate embodiment, a control system is provided for programmably adjusting the clock delay in a self-timed memory system. Data in the memory system is accessed in response to a clock signal by addressing a memory array of memory cells with an address signal issued by address decode circuitry in response to the clock. The addressed data is output from the memory system through an array of sense amplifiers which are enabled by a sense enable signal whose timing in relation to the clock signal and/or address signal is programmably controlled. Timing control is provided by a sense enable signal generator that generates a plurality of sense enable signals which are delayed with respect to the clock signal and/or address signal. The sense enable signal generator then selects one of the plurality of sense enable signals for output as an output sense enable signal to a sense amplifier in response to a control signal. The control signal is generated by a control circuit to specify a desired amount of delay between the output sense enable signal and the first address signal in response to programmable input data.

In accordance with yet another embodiment of the present invention, a method for controlling the timing of an output signal on a signal path is provided. Thus, the timing of the output signal in relation to the input signal may be controlled, or the timing of the output signal in relation to an external reference signal may also be controlled. In one embodiment, the timing of the output signal in relation to an input signal on a signal path is controlled by generating a plurality of delayed versions of the input signal, such as by using a first plurality of inverters to generate a first delayed version of the input signal, and using a second plurality of inverters to generate a second delayed version of the input signal. The desired timing delay between the output signal and the input signal may be programmably determining with reference to external control signals (such as test control signals stored in JTAG registers) that are used to generate a selection control signal. In response to the selection control signal, one of the plurality of delayed versions of the input signal is selected that corresponds to the desired timing margin and is output as the output signal.

The foregoing and other objects, features, and advantages of the invention will be apparent from the following more particular description of preferred embodiments of the invention, as illustrated in the accompanying drawings.

BRIEF DESCRIPTION OF THE DRAWINGS

The present invention may be better understood, and its numerous objects, features and advantages made apparent to those skilled in the art by referencing the accompanying drawings.

DETAILED DESCRIPTION

In accordance with a selected embodiment of the present invention, a programmable delay select circuit and methodology is provided for programmably choosing or selecting an appropriate delay among a variety of delay values for use in the operation of a specified circuit configuration. A selected embodiment of the present invention is depicted in FIG. 3, which shows a memory circuit diagram implementing a programmable signal delay selection circuit in accordance with the present invention.

Figure 1:
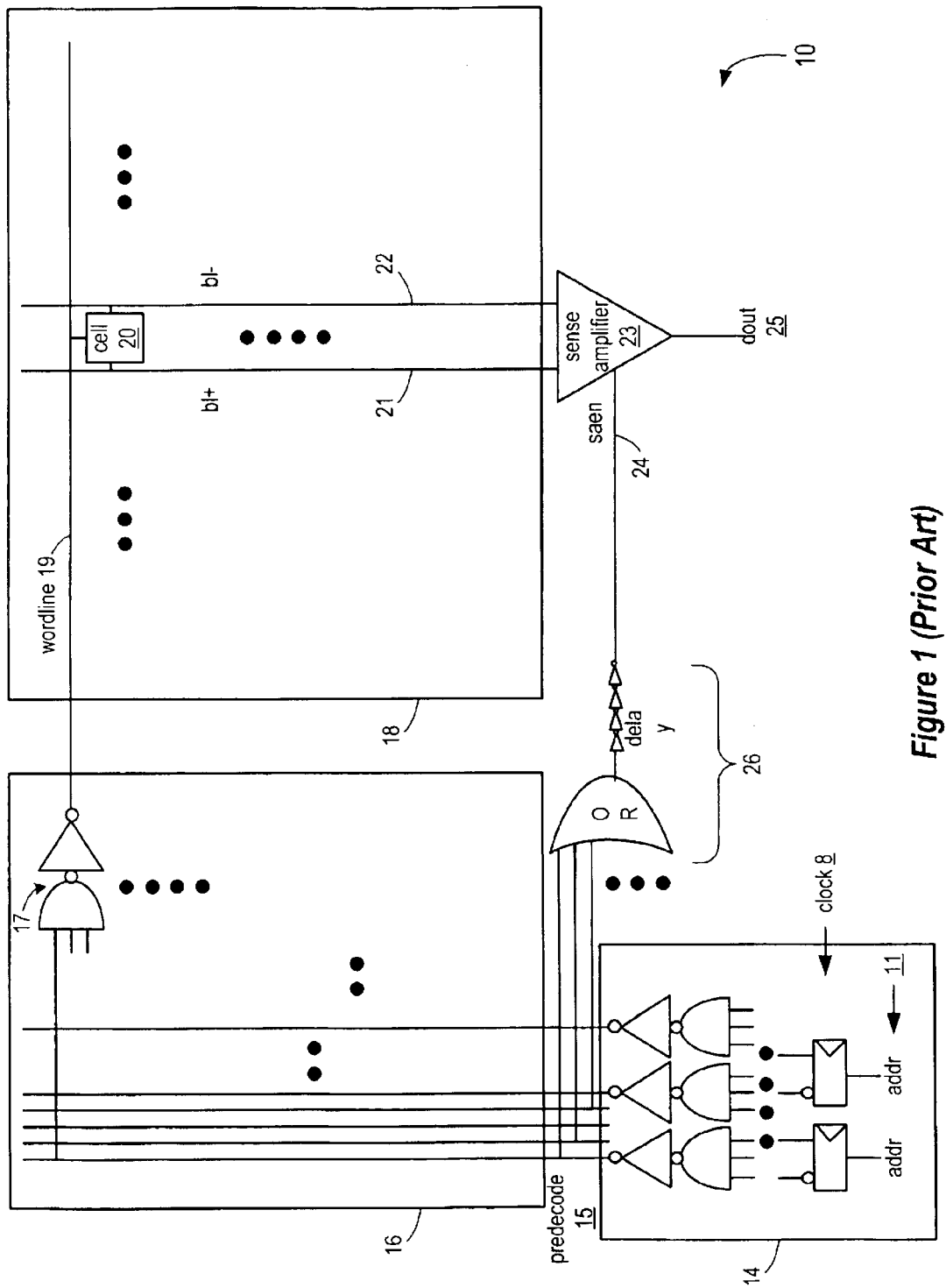
FIG. 1 depicts a conventional delay generation scheme used in a memory circuit.
Figure 2:
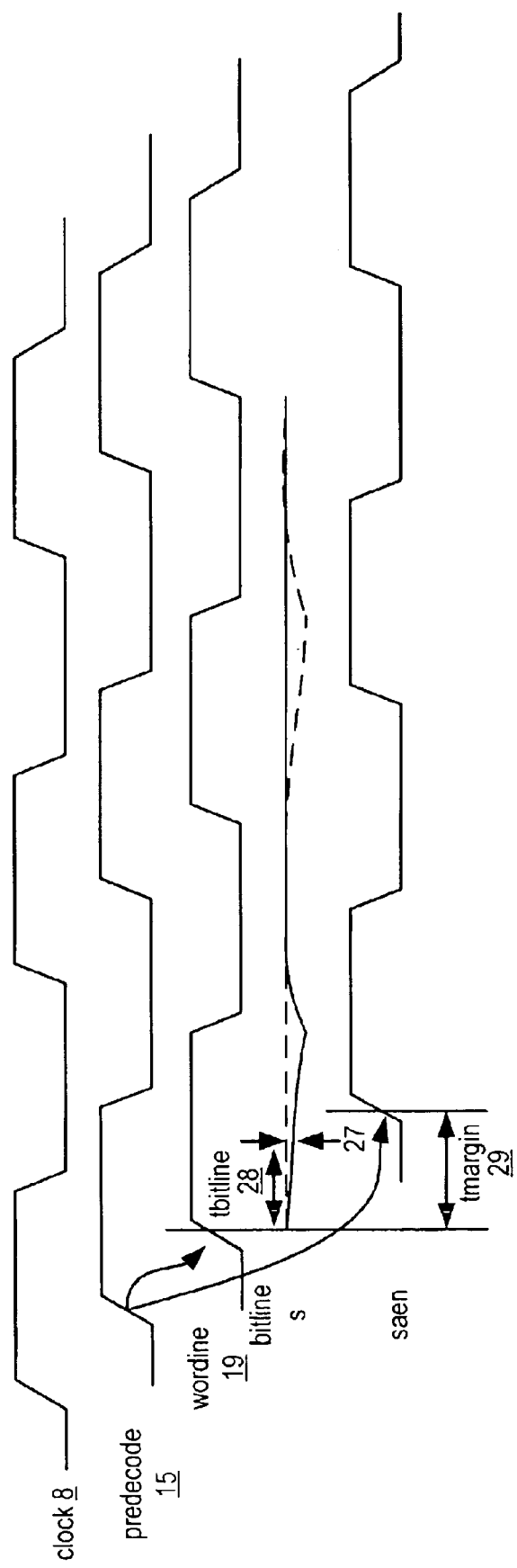
FIG. 2 shows a timing diagram of selected signals in the memory circuit depicted in FIG. 1 using a conventional delay generation scheme.
Figure 3:
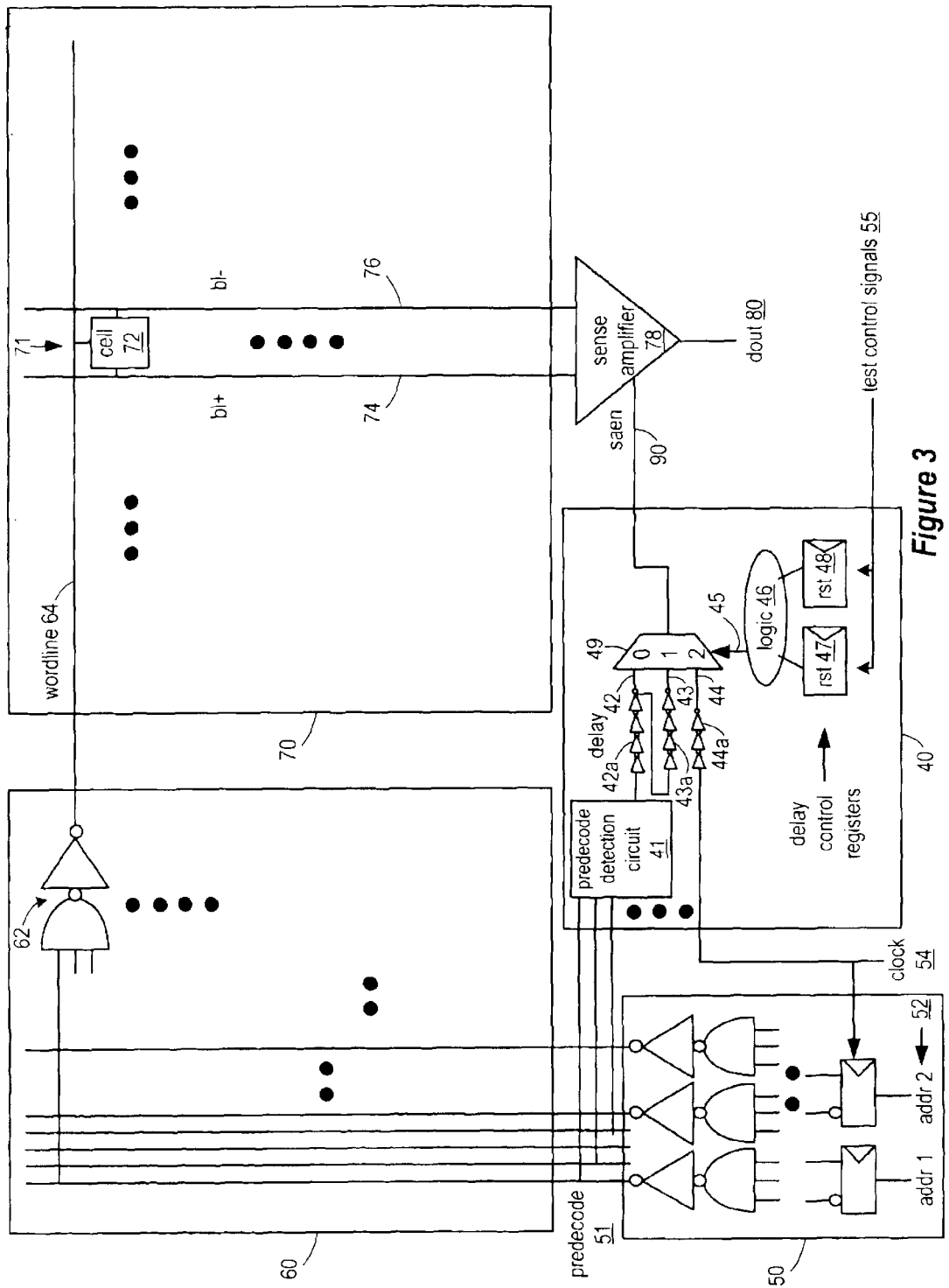
FIG. 3 depicts a circuit diagram implementing a programmable signal delay selection circuit in accordance with the present invention.

In the illustrated embodiment depicted in FIG. 3, a simplified block diagram of the programmable, self-timed memory control system embodiment is illustrated in accordance with the present invention. A plurality of address signals, addr1, addr2 (collectively referred to as the address signals 52) are provided to the input of an address predecode circuit 50 for generating predecode signals 51 under control of an input clock 54. The predecode signals 51 are provided to the input of a wordline decoder 60 for selecting one of a plurality of wordline signals (e.g., wordline 64). A plurality of logic gates (e.g., 62) are provided within the wordline decoder 60 for asserting the respective wordline signals on the corresponding wordline conductors, where the logic gates 62 will impose a finite time delay on the propagation of the selected wordline. Though not explicitly shown in FIG. 3, persons skilled in the art will understand that there may be bitline circuit decoder circuitry and/or dummy wordline driver circuitry used in connection with accessing a specific memory cell in the memory array 70. Again, each of such decode and driver circuits will include logic gates and other circuit components that will delay propagation of a bitline or dummy line signal through said circuitry. However, for purposes of the present invention, the wordline decode circuit 60 sufficiently illustrates an example of the type of delay which is programmably addressed by the present invention.

Continuing with reference to FIG. 3, the memory array 70 primarily includes an array or matrix of core memory cells (e.g., 72) organized as a series of rows and columns as known to those skilled in the art. The particular number of rows and columns depends upon the size of the memory array 70, although the present invention is not limited to any particular memory array size, or for that matter, to a memory circuit implementation. Instead the circuit example of FIG. 3 illustrates in general how a programmable delay may be inserted between a first circuit element (e.g., predecoder circuit 50) and a second circuit element (e.g., sense amplifier 78) so that the relative timing of circuit signals, such as those input to sense amplifier 78, are flexibly and correctly self-timed.

Each column of the array of core memory cells (e.g., column 71) is coupled to a corresponding pair of complementary bitlines (e.g., 74, 76), which are further coupled to a sense amplifier circuit 78, which may be one of an array of sense amplifier circuits distributed along the array 70. The complementary bitline pairs (e.g., 74, 76) are preferably initially precharged to a logic level so that when the memory cell 72 is coupled to the bitlines 74, 76, a differential voltage develops across the bitlines 74, 76 depending upon the particular data bit being asserted. As will be appreciated by those skilled in the art, a voltage difference between the bitline voltages is sensed and amplified by sense amplifier circuit 78 when enabled by the sense amplifier enable signal 90. In this manner, only one memory cell (e.g., 72) of the memory array 70 is selected by wordline and bitline selection signals for asserting data on the bitline pairs 74, 76 for output via sense amplifier 78 to the data output signal 80.

Because of variations in the circuit performance and structure, the signal propagation characteristic for a first memory cell in the array 70 may differ, depending up whether the memory is operating in its normal read mode or in a burn-in test mode, so that a longer delay is required in one mode than another. Also, the signal propagation characteristic for a first memory cell in the array 70 may be different from the signal propagation characteristic of a second cell in the array 70. For example, the time required for an address presented at the predecode circuit 50 to clock through to a first column of cells 71 in the array 70 may be different from the time required for a different address presented at the predecode circuit 50 to clock through to a different column of cells. As a result, a delay in generating the sense amplifier enable signal 90 for the first column of cells 71 may be sufficient to allow the bitline differential to develop for the first column, but may not be sufficient for a different memory cell column in the array 70 due to delays in the wordline and bitline decoding operation for the second column.

To provide a flexible and programmable delay circuit, the present invention allows for an input signal to be programmably delayed so that one of a plurality of delayed versions of the input signal can be selected and output for use under control of one or more control signals. In a selected embodiment, an input signal is used to generate multiple delayed versions of the input signal, any one of which is available for output as a delayed version of the input signal, where the amount of delay is programmably controlled. Control signals may be used to select as an output one of the multiple delayed signals and/or the original input signal. In this way, a programmable delay circuit is provided to flexibly generate output signals that are delayed with reference to the input signal. In addition, the present invention allows the programmable generation of an output signal that is either faster than or slower than an external reference signal. In addition, the programmable delay circuit can also generate an output signal that uses a different clock edge than the external reference signal so as to make the delay cycle time dependent.

Referring again to the exemplary embodiment details depicted in FIG. 3, a programmable delay circuit 40 is provided to receive as inputs the predecode signal 51 generated by the address predecode circuit 50 and the clock signal 54. In addition, control signals, such as test control signals 55, are received as inputs to the programmable delay circuit 40. In response to these input signals, an output signal is generated, such as sense amplifier enable signal 90. As illustrated in FIG. 3, each of the plurality of predecode signals 51 is coupled as an input to a logic circuit 41 within the programmable delay circuit 40. The logic circuit 41 may be implemented as a simple OR gate or with an OR-AND structure or with any of a variety of predecode detection circuits known to those skilled in the art to provide additional logical functionality for converting a predetermined set of input signals to an output signal. The output from logic circuit 41 is connected to a multipath delay generator for generating delayed versions of the signal from logic circuit 41. As illustrated in FIG. 3, multiple delayed versions of the logic circuit 41 output are generated using a first plurality of inverters 42a to generate a first delayed signal 42, and a second plurality of inverters 43a coupled in series with the first plurality of inverters to generate a second delayed signal 43. As will be appreciated, additional delayed signals can be generated using additional delay circuits connected to the output of logic circuit 41. Each of the delay signal versions 42, 43 are input to a multiplexer 49 which is used to select as an output from among the various input signals.

In addition to the delayed signals 42, 43 that are coupled as inputs to the multiplexer 49, the output of the logic circuit 41 may be coupled directly as an additional input to multiplexer 49 to be available for selection as an output. Multiplexer 49 may also have additional inputs available for selection, such as a clock signal 54 or a delayed clock signal that has been inverted by a plurality of inverters 44a to provide a delayed and/or inverted cycle time dependent input signal 44 for possible selection by the multiplexer 49.

The multiplexer 49 selects the appropriate delay from the various delay options presented as inputs to the multiplexer 49. The signal selection is controlled by selection logic 46 which receives as inputs values stored in control registers (e.g., registers 47, 48). In a selected embodiment, the control registers are controlled by control signals 55 presented to the programmable delay circuit 40. In another embodiment, the control registers receive data reflecting performance conditions in which the circuit is operating. For example, when the circuit is being used in a burn-in application, a first set of control signals is applied to the programmable delay circuit 40, but when the circuit is being used in normal operating conditions, a second set of control signals is applied to the registers 47, 48. In addition, the control registers may have a default or reset state that is selected for normal operation unless the registers are explicitly written when different delay characteristics from the programmable delay circuit 40 are required. For example, these delay control registers may be defined as JTAG test registers.

In the embodiment depicted in FIG. 3, a first delay signal 42 and second delay signal 43 are available for selection by multiplexer 49. In addition, a clock edge signal 44 is also available for selection by multiplexer 49. As a result, an output signal (sense amplifier enable signal 90) from the programmable delay circuit 40 can be programmably delayed with respect to an external reference signal (for example, selection signals for memory cell 72) so that a slower delay or faster delay or even a delay generated from another lock edge is available to make the delay cycle time dependent when generating the sense amplifier enable signal 90. In one embodiment, the present invention may be used during burn-in testing when more delay is required for generating the sense amplifier enable signal 90. The additional delay is obtained by writing test control data values to the control registers 47, 48.

In another embodiment, a programmable delay functionality is useful during prototyping design work of a VLSI chip. In particular, use of a programmable delay allows several delay options to be tested so that the most suitable delay can be chosen to maximize the performance versus margin trade-off. The use of the programmable delay described herein during the design phase is a significant improvement over conventional trial and error techniques which use FIB options or metal mask options that can be time consuming, expensive and less flexible.

As indicated above, the present invention may be used to control the signal propagation timing between any two circuit elements, and is not limited to the memory circuit application depicted in FIG. 3. For example, other potential applications include, but are not limited to, arithmetic units such as adders or multipliers, microprocessors, microcontrollers, programmable logic arrays, field programmable logic arrays, network controller circuits, field programmable gate arrays, programmable array logic devices and any other integrated circuit devices wherein multiple signals propagate through circuit components in the integrated circuit to achieve a coordinated functional result.

Figure 4:
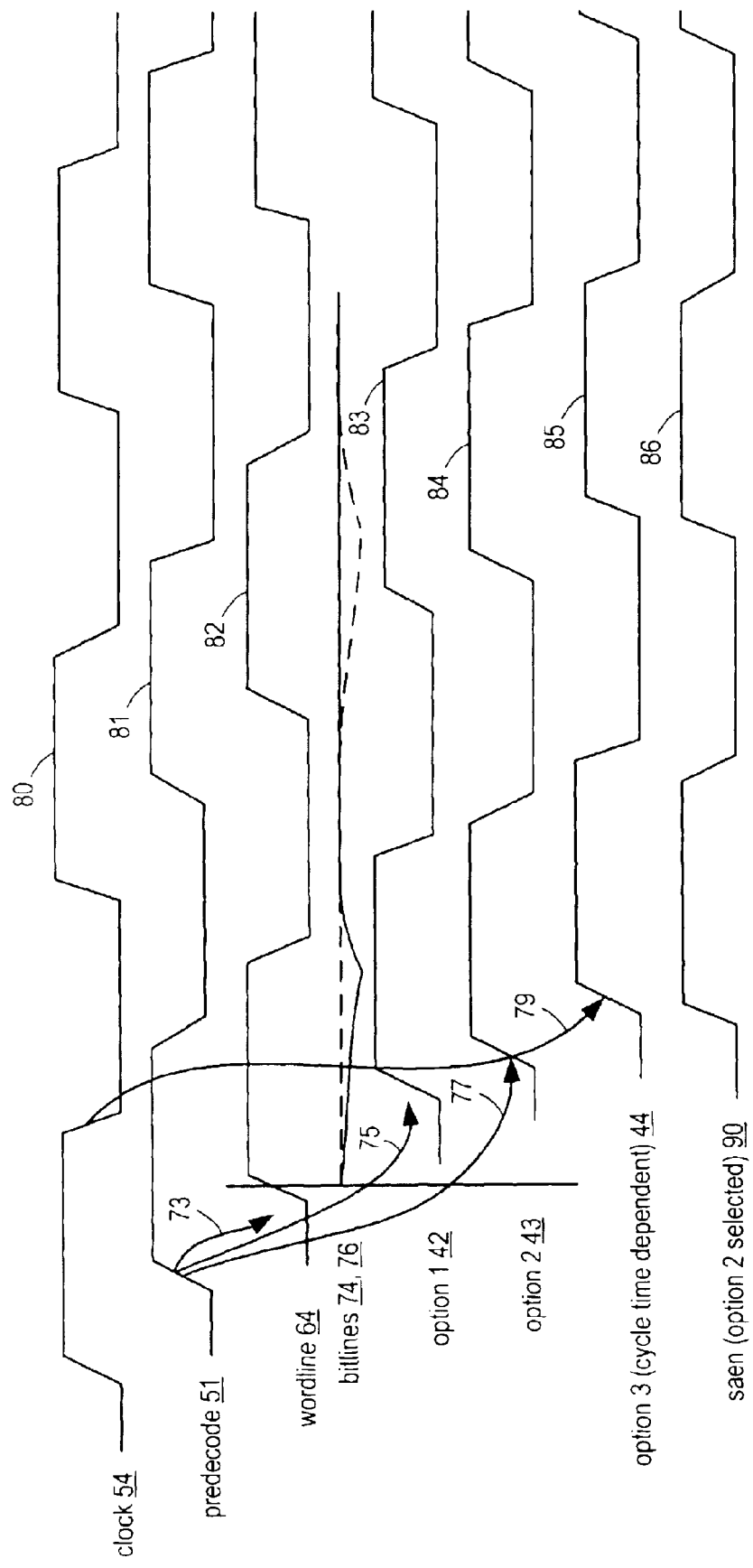
FIG. 4 depicts a timing diagram for selected signals developed in the example circuit of FIG. 3.

Though the present invention is not confined to the memory circuit application depicted in FIG. 3, the timing diagram illustrated in FIG. 4 illustrates the benefits of a selected embodiment of the present invention wherein multiple delayed version of an input signal are selected under control of test control signals to generate an output signal. As shown in FIG. 4 with reference to the memory circuit example depicted in FIG. 3, an input clock signal 54 (waveform 80) is provided as an input to a first circuit element (e.g., predecode circuit 50). As illustrated in FIG. 4, the rising edge of clock signal 54 causes the address predecode circuit 50 to generate a predecode signal output 51 (waveform 81), based upon the address input signals 52 presented to the predecode circuit 50. It will be appreciated that the predecode signal 51 (waveform 81) shown in FIG. 4 is representative of change in the predecode signal output 51 in a broad sense, and is not necessarily requiring a single data value transition.

As will be appreciated, a change in the predecode signal 51 that is input to the wordline decoder 60 will cause the wordline decoder output to change. For example, when the predecode signal 51 corresponds to the wordline for memory cell 72, a transition in the wordline 64 (waveform 82) will occur after the predecode signal 51 has propagated through the wordline decoder 60. The amount of time required for this signal to propagate through the wordline decoder 60 is a function of the wordline decoder circuitry, which includes logic gates and/or other circuit components that delay the propagation of the signal to wordline 64. The timing relationship between the predecode signal transition and the wordline and bitline signal transitions are indicated in FIG. 4 by the reference arrow 73. As shown in FIG. 3, any data stored in memory cell 72 that is addressed by the wordline 64 and bitlines 74, 76 may be output from the array 70 using a sense amplifier circuit 78 to generate a data output 80.

Where it is desired to control the operation of a first circuit (e.g., sense amplifier 78) in relation to a second circuit (e.g., memory array 70), the present invention provides a method and apparatus for generating a plurality of control signals for controlling the first circuit and then selecting from the plurality of control signals, depending upon the specific delay relationship desired. In addition, the present invention provides a method and apparatus for controlling the timing relationship of a first signal in relation to a second signal by generating multiple delayed versions of the first signal and then choosing the desired delayed version of the first signal. As depicted with reference to the timing diagram of FIG. 4, a first signal (e.g., predecode signal 51 shown in FIG. 4 as waveform 81) is used to generate a plurality of delayed versions of this signal, which are shown in FIG. 4 as option 1 (waveform 83) and option 2 (waveform 84). In particular, a transition in the predecode signal 51 propagates through a first delay path 42a to generate a delayed version of the input signal (option 1), as indicated by reference arrow 75. Though the first delayed signal 42 that is depicted in FIG. 4 as waveform 83 may be generated using a plurality of inverters 42a, such as shown in FIG. 3, it will be appreciated that other circuit techniques can be used for purposes of generating a first delayed signal 42.

In addition to generating a first delayed signal (waveform 83), a second delayed signal 43 (option 2) may be generated in response to the input predecode signal 51 (indicated by reference arrow 77). Although the second delayed signal 84 can be generated with reference to the first delayed signal by using a plurality of inverters 43a, other circuit delay techniques can also be used in accordance with the present invention. Although only two delayed waveforms 83, 84 are depicted in FIG. 4, it will be appreciated that additional delayed version of the input predecode signal 51 can be generated. In addition, an un-delayed version of the input predecode signal may also be generated by, for example, using the input to the first plurality of inverters 42a.

Once a plurality of delayed input signals are generated, the present invention provides for programmably selecting one of the plurality of delayed signals to obtain a specified and desired amount of delay for the input signal. In a selected embodiment, a multiplexer circuit 49 is provided to receive multiple input signals (such as the plurality of delayed input signals) and outputting a single output signal (e.g., sense amplifier enable signal 90) in response to control signals 45 received at the multiplexer 49. Persons skilled in the art will understand that a variety of multiplexer circuits can be used in connection with the present invention to select amongst a plurality of possible delay signals, the present invention is not necessarily confined to traditional multiplexer circuits, but also encompasses any technique for selecting amongst multiple input signals to generate a single output signal.

In addition to selecting from a plurality of delayed input signals, other input signals may be provided for selection as a possible output in accordance with the present invention. For example, when it is desired to obtain a delay that is cycle time dependent, the clock signal for the overall circuit may be provided as another possible input for selection by the multiplexer 49. For example, where a clock signal 54 is used to clock the address predecode circuit 50, this same clock signal 54 may be applied through a plurality of inverters 44a to provide a third option signal 44, which is depicted in FIG. 4 as waveform 85. As depicted, the third option 44 is a time delayed and inverted version of the input clock signal 54, and is available for selection by the selection circuit 49, along with the other delayed versions of the input signal 42, 43.

Where multiple versions of the first signal are available for selection by a multiplexer or selection circuit 49, a specific desired timing relationship may be obtained with reference to an external signal (e.g., wordline signal 64) by use of delay control signals that are used to select a specific amount of delay that is desired for the input signals with reference to the external signal. This is shown in FIG. 3 where control signals 55 are used to control selection logic 46 that controls the selection function of multiplexer 49. For example, when it is desired to select a second delayed signal 43 (depicted in FIG. 4 as waveform 84) as the sense amplifier enable signal 90, control signals 55 cause selection logic 46 to generate a selection signal 45 for multiplexer 49 such that the second delayed signal 43 is passed through the multiplexer as the sense amplifier enable signal 90, as shown at waveform 86 in FIG. 4.

In the exemplary embodiment depicted in FIG. 3, the multiplexer 49 acts as a selector, and is controlled by data stored in control registers 47, 48. These control registers store data specifying the timing relationship or delay that is imposed on the signal output from the delay controller 40. In particular, the delay controller is programmably controlled by control signals 55, such as test control signals. The control registers 47, 48 may be implemented to reset to a particular state so that a default delay option is selected unless the registers are explicitly written. For example, delay control registers 47, 48 may be defined as JTAG test registers. In accordance with the foregoing, a plurality of delays are optionally generated so that the delay circuit output signal can be faster or slower than an external reference signal. This is accomplished with control signals 55 to select a shorter delay (to make the output signal "faster") or a longer delay (to make the output signal "slower"). In addition, by selecting as an output the clock input signal 54 or an inverted or delayed version of the clock 44, the output from the delay controller 40 may be generated from another clock edge to make the delay cycle-time dependent.

Figure 5:
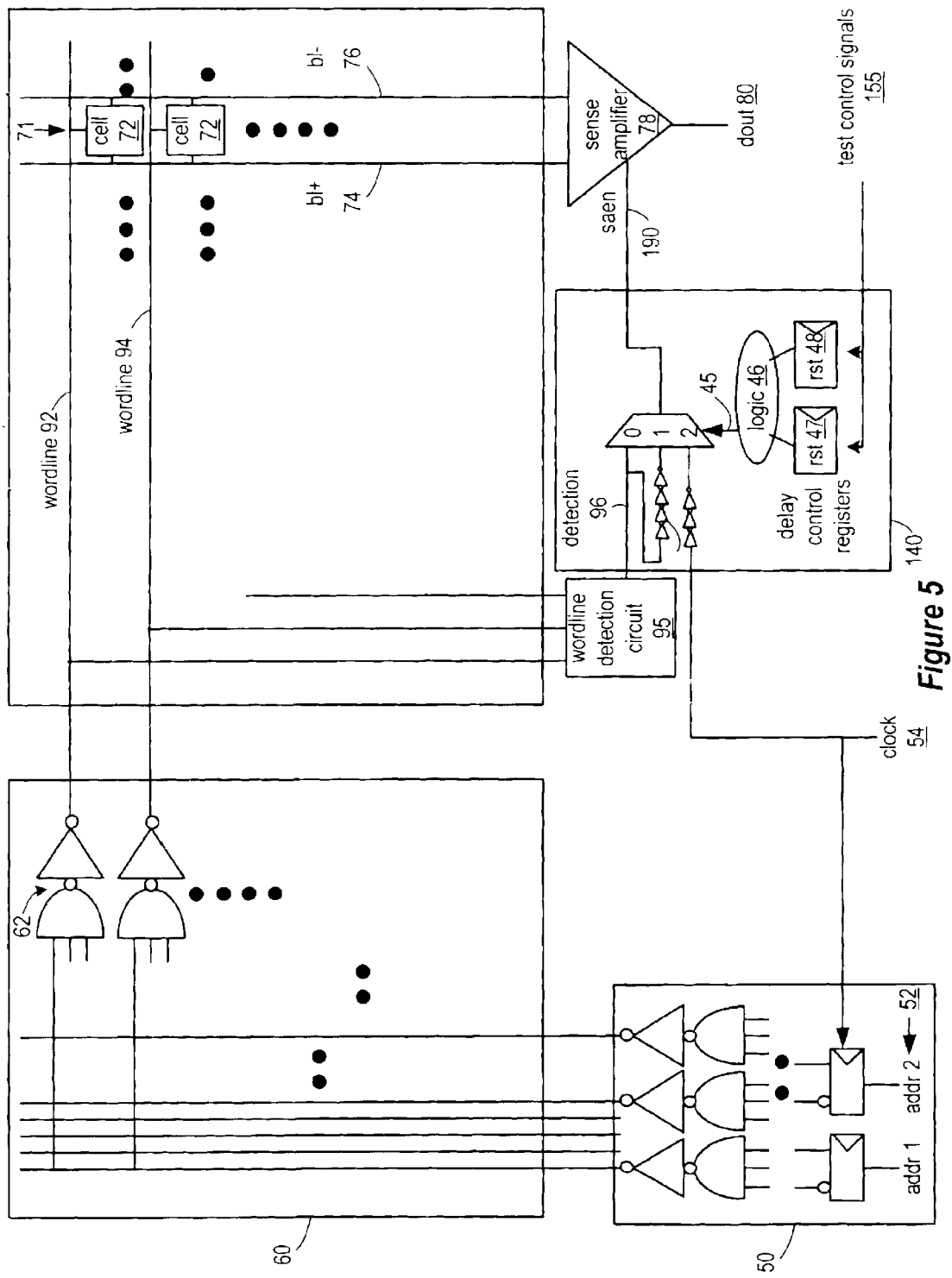
FIG. 5 depicts another circuit diagram implementing a programmable signal delay selection circuit in accordance with the present invention.

FIG. 5 depicts another circuit diagram implementing a programmable signal delay selection circuit in accordance with the present invention whereby the timing of an output signal (e.g., saen 190) in relation to an external reference signal may also be controlled. As shown in FIG. 5, a wordline detection circuit 95 is coupled to detect the status of external reference signals, such as word line signals 92, 94 and output a detection signal 96. A programmable delay circuit 140 receives the detection signal 96 generated by the wordline detection circuit 95. In addition, control signals, such as test control signals 155, are received as inputs to the programmable delay circuit 140. In response to these input signals, an output signal is generated, such as sense amplifier enable signal 190. As illustrated in FIG. 5, each of the plurality of wordline signals 92, 94 is coupled as an input to a wordline detection circuit 95. The wordline detection circuit 95 may be implemented as a simple OR gate or any of a variety of wordline detection circuits known to those skilled in the art to provide additional logical functionality for converting a predetermined set of wordline signals to an output signal. The output from wordline detection circuit 95 is connected to a multipath delay generator for generating delayed versions of the signal from wordline detection circuit 95. Each of the delayed versions of the detected signal are input to a multiplexer which is used to select as an output from among the various input signals.

In a representative application, the present invention may be used during circuit test operations or example for burn-in testing. During burn-in testing, more delay is required for the sense amplifier enable signal to accommodate the slower memory cell access time. The present invention provides the flexibility to increase the signal delay by choosing or selecting a slower delay by writing test control registers with data to select a delayed version of the sense enable signal. This programmable delay is also very useful at the prototyping stage of a VLSI chip where several delay options can be tested to choose the most suitable delay from a performance vs. margin trade-off. Thus, the present invention provides substantial advantages over conventional trial-and-error techniques, such as using FIB options or metal-mask options, which can be very time consuming, very expensive and less flexible.

While the system and method of the present invention has been described in connection with the preferred embodiment, it is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A programmable delay circuit for use in a clocked logic system to control the timing of a signal path between a first circuit and a second circuit, comprising:

an input terminal for receiving at least a first input signal from a first circuit;

an output terminal for outputting a delayed version of the input signal as an output signal to a second circuit;

a plurality of delay circuits coupled to the input terminal for generating a plurality of delayed versions of the input signal;

a selector circuit coupled to the output terminal for coupling one of the plurality of delayed versions of the input signal in response to a selection control signal; and a timing controller for generating the selection control signal in response to a programmable delay control signal which determines the amount of delay for the signal path.

2. The programmable delay circuit of claim 1, where the selector circuit comprises a multiplexer.

3. The programmable delay circuit of claim 1, where the plurality of delay circuits comprises:

a first plurality of inverter gates coupled to the input terminal for generating a first delayed version of the input signal at an output of the first plurality of inverter gates; and a second plurality of inverter gates coupled to the output of the first plurality of inverter gates for generating a second delayed version of the input signal at an output of the second plurality of inverter gates.

4. The programmable delay circuit of claim 1, where the plurality of delay circuits comprises a clock delay circuit coupled to receive an input clock signal for generating a delayed version of the input clock signal.

5. The programmable delay circuit of claim 4, where the clock delay circuit comprises an inverter for generating a delayed cycle-time dependent signal that may be selected by the selector circuit.

6. The programmable delay circuit of claim 1, where the timing controller comprises:

a control register for receiving the programmable delay control signal; and selection logic for generating the selection control signal to select a first delayed version of the input signal when the programmable delay control signal indicates that burn-in testing is being conducted on the clocked logic system.

7. The programmable delay circuit of claim 1, wherein one of the delayed versions of the input signal has a delay of zero.

8. A method for controlling the timing of an output signal on a signal path in relation to an input signal on the signal path, comprising:

generating a plurality of delayed versions of the input signal;

programmably determining a desired timing margin in a signal path of said system; and selecting one of the plurality of delayed versions of the input signal that corresponds to the desired timing margin and outputting the selected delayed version of the input signal as the output signal.

9. The timing control method of claim 8, wherein the generation of a plurality of delayed versions of the input signal comprises:

coupling the input signal through a first delay circuit to generate a first delayed version of the input signal; and coupling the input signal through a second delay circuit to generate a second delayed version of the input signal.

10. The timing control method of claim 8, wherein the generation of a plurality of delayed versions of the input signal comprises coupling an input clock signal through a first delay circuit.

11. The timing control method of claim 8, wherein the selection of one of the plurality of delayed versions of the input signal is performed during prototyping of a VLSI chip that contains the signal path to test performance of the VLSI chip.

12. The timing control method of claim 8, wherein the selection of one of the plurality of delayed versions of the input signal is performed during burn-in testing of a VLSI chip that contains the signal path.

13. The timing control method of claim 8, wherein the step of programmably determining a desired timing margin comprises processing test control signals to generate a first selection control signal, and the step of selecting one of the plurality of delayed versions of the input signal comprises multiplexing the plurality of delayed versions of the input signal to generate an output signal in response to the first selection control signal.

14. The timing control method of claim 8, wherein the step of programmably determining a desired timing margin comprises determining a first timing margin when a first input control signal is received and determining a second timing margin when a second input control signal is received.

15. The timing control method of claim 14, wherein a first delayed version of the input signal is output as the output signal when the first selection control signal is received and a second delayed version of the input signal is output as the output signal when the second selection control signal is received.

16. A control system for programmably adjusting the clock delay in a self-timed memory system for accessing data in a memory system in response to the assertion of a clock signal, the memory system including a memory array of memory cells which are addressed by a first address signal and a corresponding array of sense amplifiers receiving a sense enable signal for enabling the sense amplifiers to sense data in the addressed memory cells, said control system comprising:

address decode circuitry to generate a first address signal in response to a clock signal;

a sense enable signal generator to generate a plurality of sense enable signals which are delayed with respect to the clock signal and to select one of the plurality of sense enable signals for output as an output sense enable signal to a sense amplifier in response to a control signal; and a control circuit for generating the control signal to specify a desired amount of delay between the output sense enable signal and the first address signal.

17. The control system of claim 16, wherein the sense enable signal generator comprises:

a detection circuit for generating a first sense enable signal in response to detecting a first address signal;

a first delay circuit for generating a second sense enable signal that is delayed with respect to the first sense enable signal; and a multiplexer for selecting between the first and second sense enable signals for output as the output sense enable signal in response to the control signal.

18. The control system of claim 17, wherein the first delay circuit comprises a plurality of inverters coupled to receive the first sense enable signal and to output the second sense enable signal to the multiplexer.

19. The control system of claim 17, wherein the control circuit comprises a resettable control register for storing a test control signal and for generating a control signal to specify that the second sense enable signal be output from the sense enable signal generator.

20. The control system of claim 17, wherein the sense enable signal generator comprises a second delay circuit for generating a third sense enable signal that is delayed with respect to the clock signal.

* * * * *